(12) United States Patent
Jeong et al.

(10) Patent No.: US 12,095,478 B2
(45) Date of Patent: *Sep. 17, 2024

(54) MEMORY AND OPERATION METHOD OF MEMORY

(71) Applicant: SK hynix Inc., Gyeonggi-do (KR)

(72) Inventors: Jin Ho Jeong, Gyeonggi-do (KR); Dae Suk Kim, Gyeonggi-do (KR); Munseon Jang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 111 days.

This patent is subject to a terminal disclaimer.

(21) Appl. No.: 17/877,484

(22) Filed: Jul. 29, 2022

(65) Prior Publication Data
US 2022/0368351 A1 Nov. 17, 2022

Related U.S. Application Data

(63) Continuation-in-part of application No. 17/330,881, filed on May 26, 2021, now Pat. No. 11,442,810.
(Continued)

(51) Int. Cl.
*H03M 13/11* (2006.01)
*H03M 13/15* (2006.01)
(Continued)

(52) U.S. Cl.
CPC ... *H03M 13/1177* (2013.01); *H03M 13/1575* (2013.01); *H03M 13/159* (2013.01); *G06F 17/16* (2013.01); *G11C 29/52* (2013.01); *H03M 13/05* (2013.01); *H03M 13/116* (2013.01); *H03M 13/255* (2013.01); *H03M 13/2906* (2013.01); *H03M 13/616* (2013.01)

(58) Field of Classification Search
CPC ............ H03M 13/255; H03M 13/116; H03M 13/616; H03M 13/2906; H03M 13/05; H03M 13/1177; H03M 13/1575; H03M 13/159; G06F 17/16; G11C 29/52
See application file for complete search history.

(56) References Cited

U.S. PATENT DOCUMENTS

2011/0185251 A1* 7/2011 d'Abreu ............... G06F 11/1072
714/752
2019/0074850 A1* 3/2019 Hsiao .................... G06F 3/0604
(Continued)

FOREIGN PATENT DOCUMENTS

KR 10-2021-0157829 A 12/2021

*Primary Examiner* — April Y Blair
*Assistant Examiner* — Sazzad Hossain
(74) *Attorney, Agent, or Firm* — IP & T GROUP LLP

(57) ABSTRACT

A memory includes a first check matrix calculation circuit suitable for generating a first parity by calculating a group indicator portion of a check matrix and a write data; a memory core suitable for storing the write data and the first parity; a first syndrome calculation circuit suitable for generating a first syndrome by adding the first parity which is read from the memory core to a first calculation result obtained by calculating the group indicator portion and the data which is read from the memory core; and a failure determination circuit suitable for accumulating the first syndromes for a region of the memory core to generate a vector and determining a presence of a failure of the region based on the vector.

14 Claims, 19 Drawing Sheets

Related U.S. Application Data

(60) Provisional application No. 63/094,415, filed on Oct. 21, 2020, provisional application No. 63/042,193, filed on Jun. 22, 2020.

(51) Int. Cl.
  *G06F 17/16* (2006.01)
  *G11C 29/52* (2006.01)
  *H03M 13/00* (2006.01)
  *H03M 13/05* (2006.01)
  *H03M 13/25* (2006.01)
  *H03M 13/29* (2006.01)

(56) References Cited

U.S. PATENT DOCUMENTS

| | | |
|---|---|---|
| 2020/0097360 A1 | 3/2020 | Lu |
| 2020/0142771 A1 | 5/2020 | Cho et al. |
| 2021/0083687 A1* | 3/2021 | Lee ..................... H03M 13/116 |
| 2021/0224156 A1 | 7/2021 | Cho et al. |
| 2023/0368860 A1* | 11/2023 | Jeong ................ H03M 13/2906 |

* cited by examiner

FIG. 2

| DATA | | | | | | | | ECC | | | |
|---|---|---|---|---|---|---|---|---|---|---|---|
| D0 | D1 | D2 | D3 | D4 | D5 | D6 | D7 | E0 | E1 | E2 | E3 |
| 1 | 1 | 1 | 0 | 1 | 1 | 1 | 1 | 1 | 0 | 0 | 0 |
| 1 | 1 | 0 | 1 | 1 | 0 | 0 | 1 | 0 | 1 | 0 | 0 |
| 1 | 0 | 1 | 1 | 0 | 1 | 0 | 1 | 0 | 0 | 1 | 0 |
| 0 | 1 | 1 | 1 | 0 | 0 | 1 | 1 | 0 | 0 | 0 | 1 |

FIG. 3

| DATA | | | | | | | | ECC | | | |
|---|---|---|---|---|---|---|---|---|---|---|---|
| D0 | D1 | D2 | D3 | D4 | D5 | D6 | D7 | E0 | E1 | E2 | E3 |
| 1*D0 | 1*D1 | 1*D2 | 0*D3 | 1*D4 | 1*D5 | 1*D6 | 1*D7 | 1*E0 | 0*E1 | 0*E2 | 0*E3 |
| 1*D0 | 1*D1 | 0*D2 | 1*D3 | 1*D4 | 0*D5 | 0*D6 | 1*D7 | 0*E0 | 1*E1 | 0*E2 | 0*E3 |
| 1*D0 | 0*D1 | 1*D2 | 1*D3 | 0*D4 | 1*D5 | 0*D6 | 1*D7 | 0*E0 | 0*E1 | 1*E2 | 0*E3 |
| 0*D0 | 1*D1 | 1*D2 | 1*D3 | 0*D4 | 0*D5 | 1*D6 | 1*D7 | 0*E0 | 0*E1 | 0*E2 | 1*E3 |

| DATA | | | | | | | | ECC | | | |
|---|---|---|---|---|---|---|---|---|---|---|---|
| 1 | 1 | 0 | 0 | 1 | 0 | 1 | 0 | 0 | 1 | 1 | 0 |
| 1*1 | 1*1 | 1*0 | 0*0 | 1*1 | 1*0 | 1*1 | 1*0 | 1*0 | 0*1 | 0*0 | 0*0 |
| 1*1 | 1*1 | 0*0 | 1*0 | 1*1 | 0*0 | 0*1 | 1*0 | 0*0 | 1*1 | 0*0 | 0*0 |
| 1*1 | 0*1 | 1*0 | 1*0 | 0*1 | 1*0 | 0*1 | 1*0 | 0*0 | 0*1 | 1*1 | 0*0 |
| 0*1 | 1*1 | 1*0 | 1*0 | 0*1 | 0*0 | 1*1 | 1*0 | 0*0 | 0*1 | 0*0 | 1*0 |

| DATA | | | | | | | | ECC | | | |
|---|---|---|---|---|---|---|---|---|---|---|---|
| 1 | 1 | 0 | 0 | 1 | 0 | 0 | 0 | 0 | 1 | 1 | 0 |
| 1*1 | 1*1 | 1*0 | 0*0 | 1*1 | 1*0 | 1*0 | 1*0 | 1*0 | 0*1 | 0*0 | 0*0 |
| 1*1 | 1*1 | 0*0 | 1*0 | 1*1 | 0*0 | 0*0 | 1*0 | 0*0 | 1*1 | 0*0 | 0*0 |
| 1*1 | 0*1 | 1*0 | 1*0 | 0*1 | 1*0 | 0*0 | 1*0 | 0*0 | 0*1 | 1*1 | 0*0 |
| 0*1 | 1*1 | 1*0 | 1*0 | 0*1 | 0*0 | 1*0 | 1*0 | 0*0 | 0*1 | 0*0 | 1*0 |

| DATA | | | | | | | | ECC | | | |
|---|---|---|---|---|---|---|---|---|---|---|---|
| 0 | 1 | 0 | 1 | 1 | 0 | 1 | 0 | 0 | 1 | 1 | 0 |
| 1*0 | 1*1 | 1*0 | 0*1 | 1*1 | 1*0 | 1*1 | 1*0 | 1*0 | 0*1 | 0*0 | 0*0 |
| 1*0 | 1*1 | 0*0 | 1*1 | 1*1 | 0*0 | 0*1 | 1*0 | 0*0 | 1*1 | 0*0 | 0*0 |
| 1*0 | 0*1 | 1*0 | 1*1 | 0*1 | 1*0 | 0*1 | 1*0 | 0*0 | 0*1 | 1*1 | 0*0 |
| 0*0 | 1*1 | 1*0 | 1*1 | 0*1 | 0*0 | 1*1 | 1*0 | 0*0 | 0*1 | 0*0 | 1*0 |

| DATA | | | | | | | | ECC | | | |
|---|---|---|---|---|---|---|---|---|---|---|---|
| 1 | 1 | 1 | 0 | 1 | 0 | 1 | 1 | 0 | 1 | 1 | 0 |
| 1*1 | 1*1 | 1*1 | 0*0 | 1*1 | 1*0 | 1*1 | 1*1 | 1*0 | 0*1 | 0*0 | 0*0 |
| 1*1 | 1*1 | 0*1 | 1*0 | 1*1 | 0*0 | 0*1 | 1*1 | 0*0 | 1*1 | 0*0 | 0*0 |
| 1*1 | 0*1 | 1*1 | 1*0 | 0*1 | 1*0 | 0*1 | 1*1 | 0*0 | 0*1 | 1*1 | 0*0 |
| 0*1 | 1*1 | 1*1 | 1*0 | 0*1 | 0*0 | 1*1 | 1*1 | 0*0 | 0*1 | 0*0 | 1*0 |

| DQ0_Group | DQ1_Group | DQ2_Group | DQ3_Group | DQ4_Group | DQ5_Group | DQ6_Group | DQ7_Group |
|---|---|---|---|---|---|---|---|
| 0 | 1 | 1 | 1 | 0 | 0 | 0 | 1 |
| 0 | 0 | 0 | 1 | 1 | 1 | 1 | 0 |
| 1 | 1 | 0 | 0 | 1 | 1 | 0 | 1 |
| 1 | 1 | 1 | 1 | 0 | 1 | 1 | 0 |

FIG. 11

| DQ0_Group | DQ1_Group | DQ2_Group | DQ3_Group | DQ4_Group | DQ5_Group | DQ6_Group | DQ7_Group |
|---|---|---|---|---|---|---|---|
| 0 | 1 | 1 | 0 | 0 | 0 | 1 | 1 |
| 0 | 0 | 0 | 1 | 1 | 1 | 0 | 1 |
| 1 | 1 | 0 | 1 | 1 | 0 | 1 | 1 |
| 1 | 1 | 1 | 0 | 1 | 1 | 0 | 0 |

FIG. 12
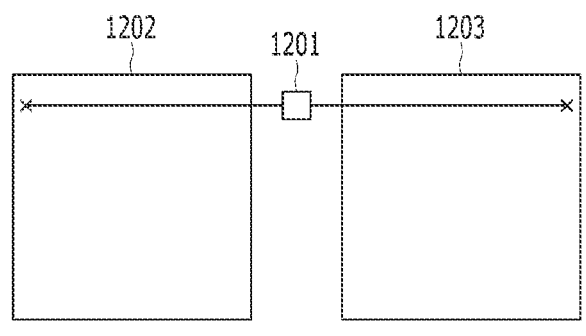
(a)
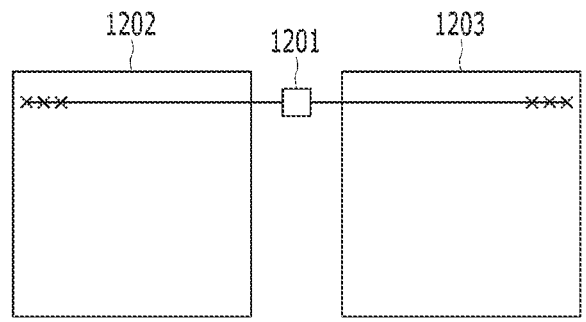
(b)

$$\begin{pmatrix} \text{Group Indicator} \\ 4 \times 128 \end{pmatrix} \times \begin{pmatrix} D0 \\ D1 \\ D2 \\ D3 \\ \vdots \\ D127 \end{pmatrix} = \begin{pmatrix} E0 \\ E1 \\ E2 \\ E3 \end{pmatrix}$$

(a)

$$\begin{pmatrix} \text{Bit Indicator} \\ 4 \times 128 \end{pmatrix} \times \begin{pmatrix} D0 \\ D1 \\ D2 \\ D3 \\ \vdots \\ D127 \end{pmatrix} = \begin{pmatrix} E4 \\ E5 \\ E6 \\ E7 \end{pmatrix}$$

(b)

$$\begin{pmatrix} \text{Group Indicator} \\ 4 \times 128 \end{pmatrix} \times \begin{pmatrix} D0' \\ D1' \\ D2' \\ D3' \\ \vdots \\ D127' \end{pmatrix} = \begin{pmatrix} E0' \\ E1' \\ E2' \\ E3' \end{pmatrix}$$

(c)

$$\begin{pmatrix} \text{Bit Indicator} \\ 4 \times 128 \end{pmatrix} \times \begin{pmatrix} D0' \\ D1' \\ D2' \\ D3' \\ \vdots \\ D127' \end{pmatrix} = \begin{pmatrix} E4' \\ E5' \\ E6' \\ E7' \end{pmatrix}$$

$$\begin{pmatrix} E0' \\ E1' \\ E2' \\ E3' \end{pmatrix} + \begin{pmatrix} E0 \\ E1 \\ E2 \\ E3 \end{pmatrix} = \begin{pmatrix} S0 \\ S1 \\ S2 \\ S3 \end{pmatrix}$$

(a)

$$\begin{pmatrix} E4' \\ E5' \\ E6' \\ E7' \end{pmatrix} + \begin{pmatrix} E4 \\ E5 \\ E6 \\ E7 \end{pmatrix} = \begin{pmatrix} S4 \\ S5 \\ S6 \\ S7 \end{pmatrix}$$

(b)

US 12,095,478 B2

MEMORY AND OPERATION METHOD OF MEMORY

CROSS-REFERENCE TO RELATED APPLICATIONS

The present application is a continuation-in-part application of U.S. patent application Ser. No. 17/330,881 filed on May 26, 2021, which claims priority to U.S. Provisional Application No. 63/042,193 filed on Jun. 22, 2020 and U.S. provisional Application No. 63/094,415 filed on Oct. 21, 2020, which are incorporated herein by reference in their entirety.

BACKGROUND

1. Field

Various embodiments of the present invention relate to a memory, and more particularly, to error correction of a memory.

2. Description of the Related Art

In the early stage of a semiconductor memory device industry, there were many originally good dies on the wafers, which means that memory chips were produced with no defective memory cells through a semiconductor fabrication process. However, as the capacity of memory devices increases, it becomes difficult to fabricate a memory device that does not have any defective memory cell. Currently, it may be said that there is substantially no chance that a memory device can be fabricated without any defective memory cells. To address this issue, a repair method of replacing defective memory cells with redundant memory cells is being used.

As another method, an error correction circuit (ECC circuit) for correcting errors in a memory system is used to correct errors occurring in memory cells and errors occurring when data are transferred during a read operation and a write operation of the memory system.

SUMMARY

Embodiments of the present invention are directed to decreasing the number of errors that may occur in error correction of a memory.

In accordance with an embodiment of the present invention, a memory includes: an error correction code generation circuit suitable for generating an M-bit error correction code based on a message including N data groups each of which includes K-bit data, where K, N and M are positive integers; a memory core including N+1 cell regions for storing the N data groups and the error correction code; and an error correction circuit suitable for correcting errors of the N data groups that are read from the memory core based on the error correction code that is read from the memory core, wherein the error correction code generation circuit generates the NI-bit error correction code based on an $M \times [(K*N)+M]$ check matrix, wherein a message part of the check matrix includes N group indicators distinguishing the N data groups and N parts of bit indicators each of which distinguishes the K-bit data in a corresponding one of the N data groups, and wherein a hamming distance between the group indicators respectively corresponding to neighboring data groups among the N group indicators is 1 or M/2.

In accordance with another embodiment of the present invention, a method for operating a memory includes: receiving N data groups each of which includes K-bit data, where K and N are positive integers; generating an M-bit error correction code by using the N data groups as a message, where M is a positive integer; and storing the N data groups and the error correction code in N+1 cell regions of a memory core, wherein the M-bit error correction code is generated based on an $M \times [(K*N)+M]$ check matrix, wherein the message part of the check matrix includes N group indicators distinguishing the N groups, and N parts of bit indicators each of which distinguishes the K-bit data groups in a corresponding one of the N data groups, and wherein a hamming distance between the group indicators respectively corresponding to neighboring data groups among the N group indicators is 1 or M/2.

In accordance with yet another embodiment of the present invention, a memory includes: an error correction code generation circuit suitable for generating an 8-bit error correction code based on a message including 8 data groups each of which includes 16-bit data; a memory core including 9 cell regions for storing the 8 data groups and the error correction code; and an error correction circuit suitable for correcting errors of the 8 data groups that are read from the memory core based on the error correction code that is read from the memory core, wherein the error correction code generation circuit generates the 8-bit error correction code based on an 8×136 check matrix, wherein a message part of the check matrix includes 8 group indicators distinguishing the 8 data groups and 8 parts of bit indicators each of which distinguishes the 16-bit data in a corresponding one of the 8 data groups, and wherein a hamming distance between the group indicators respectively corresponding to neighboring data groups among the 8 group indicators is 1 or 4.

In accordance with still another embodiment of the present invention, a memory includes: an error correction code generation circuit suitable for generating an M-bit error correction code based on a message including N data groups each of which includes K-bit data, where K, N and M are positive integers; a memory core including N+1 cell regions for storing the N data groups and the error correction code; and an error correction circuit suitable for correcting errors of the N data groups that are read from the memory core based on the error correction code that is read from the memory core, wherein the error correction code generation circuit generates the M-bit error correction code based on an $M \times [(K*N)+M]$ check matrix, wherein a message part of the check matrix includes N group indicators distinguishing the N data groups and N parts of bit indicators each of which distinguishes the K-bit data in a corresponding one of the N data groups, and wherein a sum of the group indicators respectively corresponding to neighboring data groups among the N group indicators is different from any of the N group indicators.

In accordance with still another embodiment of the present invention, a memory includes a memory core and an error correction circuitry. The memory core may include sequentially disposed N data cell regions respectively suitable for storing N data pieces and an error correction code (ECC) cell region suitable for an ECC for the N data pieces, each data piece being of K bits and the ECC being of M bits. The error correction circuitry may generate the ECC based on the N data pieces and a check matrix configured by a message part and an ECC part, the message part being of a $[M \times (K*N)]$ bit-dimension and the ECC part being of a $[M \times M]$ bit-dimension. The error correction circuitry may error-correct the N data pieces based on the N data pieces, the ECC and the check matrix. The message part may include first N sub-matrixes respectively corresponding to the N data pieces, different from one another, each of a [M/2×K] bit-dimension and each having columns identical to one another. The message part may further include second N sub-matrixes identical to one another and each configured by K vectors each of a [M/2×1] bit-dimension. A hamming distance between the columns respectively corresponding to the data pieces stored in neighboring ones among the N data cell regions may be 1 or M/2.

In accordance with another embodiment of the present invention, a memory includes: a first check matrix calculation circuit suitable for generating a first parity by calculating a group indicator portion of a check matrix and a write data; a memory core suitable for storing the write data and the first parity; a first syndrome calculation circuit suitable for generating a first syndrome by adding the first parity which is read from the memory core to a first calculation result obtained by calculating the group indicator portion and the data which is read from the memory core; and a failure determination circuit suitable for accumulating the first syndromes for a region of the memory core to generate a vector and determining a presence of a failure of the region based on the vector.

In accordance with another embodiment of the present invention, a memory includes: an error correction code generation circuit suitable for generating an error correction code based on a write data; a memory core suitable for storing the write data and the error correction code; and a failure determination circuit suitable for accumulating, for a region of the memory core, values obtained by calculating the data, which is read from the memory core, and a portion of the error correction code, and determining a presence of a failure of the region based on a result of the accumulating.

In accordance with another embodiment of the present invention, a method for operating a memory includes: selecting a row; reading data and an error correction code from memory cells that are selected by a column address of a first value in a selected row; generating a syndrome by calculating a portion of the error correction code and the data; repeating the reading and the generating by changing a value of the column address while accumulating the generated syndromes to generate a vector; and determining whether the row has a failure or not based on the accumulated value.

In accordance with another embodiment of the present invention, a memory includes: a memory core including cell groups each configured by sequentially disposed N data cell regions respectively suitable for storing N data pieces and an error correction code (ECC) cell region suitable for an ECC for the N data pieces, each data piece being of K bits and the ECC being of M bits including first and second parity codes; and an error correction circuitry suitable for: generating, for each of the cell groups, the ECC based on the N data pieces and a check matrix configured by a message part and an ECC part, the message part being of a [M×(K*N)] bit-dimension and the ECC part being of a [M×M] bit-dimension, and error-correcting, for each of the cell groups, the N data pieces by generating first and second syndromes based on the N data pieces, the check matrix and the respective first and second parity codes, wherein the message part includes first N sub-matrixes respectively corresponding to the N data pieces, different from one another, involved in generating the first parity code, each of a [M/2×K] bit-dimension and each having columns identical to one another, wherein the message part further includes second N sub-matrixes identical to one another, involved in generating the second parity code and each configured by K vectors each of a [M/2×1] bit-dimension, wherein a hamming distance between the columns respectively corresponding to the data pieces stored in neighboring data cell regions among the N data cell regions is of a predetermined value, and wherein the error correction circuitry is further suitable for detecting a failure of a sub-wordline for the cell groups by identifying the predetermined value as an element value in a sum of the first syndromes corresponding to the respective cell groups.

BRIEF DESCRIPTION OF THE DRAWINGS

FIG. 2 shows an example of a check matrix used by the error correction code generation circuit 110 and the error correction circuit 120.

FIG. 3 shows how the error correction code generation circuit 110 uses a check matrix.

FIG. 4 shows a result of the error correction code generation circuit 110 generating an error correction code ECC (0,1,1,0) for data DATA (1,1,0,0,1,0,1,0) by using the check matrix of FIG. 2.

FIG. 5 shows a process of the error correction circuit 120 correcting an error based on an error correction code ECC.

FIG. 6 shows another process of the error correction circuit 120 correcting an error based on an error correction code ECC.

FIG. 7 shows yet another process of the error correction circuit 120 correcting an error based on an error correction code ECC.

FIG. 9 shows an example of a check matrix used by the error correction code generation circuit 821 and the error correction circuit 822 of an ECC block 820 shown in FIG. 8.

FIG. 10 shows group indicators satisfying Rule (1) and Rule (2) in accordance with an embodiment of the present invention.

FIG. 11 shows group indicators satisfying Rule (1) and Rule (2) in accordance with another embodiment of the present invention.

FIG. 12 is a diagram illustrating a pattern of failure occurring in a sub-word line driver of a memory in accordance with another embodiment of the present invention.

FIG. 13 is an example of a check matrix used to detect a failure of a sub-word line driver in accordance with another embodiment of the present invention.

FIG. 17 is an equation showing an operation of the first check matrix calculation circuit 1611 and the second check matrix calculation circuit 1613 shown in FIG. 16 in accordance with another embodiment of the present invention.

FIG. 18 is an equation showing the operation of a first syndrome calculation circuit 1621 and a second syndrome calculation circuit 1623 shown in FIG. 16 in accordance with another embodiment of the present invention.

DETAILED DESCRIPTION

Figure 1:
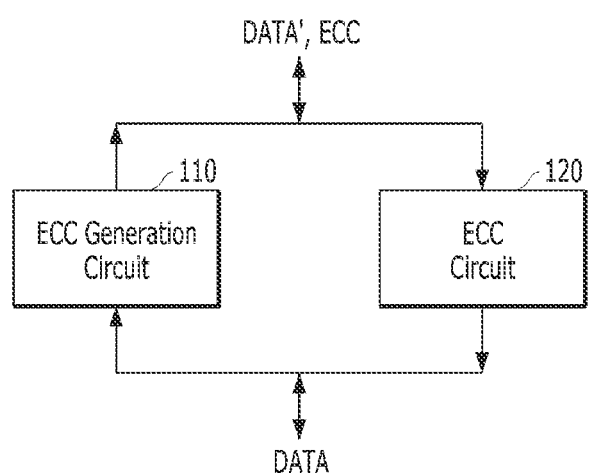
FIG. 1 is a block diagram illustrating an error correction code generation circuit 110 and an error correction circuit 120 in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating an error correction code generation circuit 110 and an error correction circuit 120 in accordance with an embodiment of the present invention.

The error correction code generation circuit 110 may generate an error correction code ECC based on data DATA transferred from the outside of the memory (transferred from a memory controller) during a write operation. That is, the error correction code generation circuit 110 may generate an error correction code ECC for correcting an error of the data DATA by encoding the data DATA. In the process of generating an error correction code ECC, the data to be encoded may also be called a message. During a write operation, the error correction code ECC is generated, but an error correction operation is not performed. Therefore, the data DATA input to the error correction code generation circuit 110 and the data DATA' output from the error correction code generation circuit 110 may be the same.

During a write operation, the data DATA' and the error correction code ECC may be stored in a memory core (not shown). Also, during a read operation, the data DATA' and the error correction code ECC may be read from the memory core and transferred to the error correction circuit 120.

During a read operation, the error correction circuit 120 may correct an error of the data DATA' based on the error correction code ECC. Here, "correcting an error" may mean detecting an error of the data DATA' by using the error correction code ECC and correcting it when an error is detected. The data DATA whose error is corrected by the error correction circuit 120 may be output to the outside of the memory. That is, the data DATA may be transferred to the memory controller. The error correction circuit 120 may correct not only an error occurring in the data DATA' but also an error occurring in the error correction code ECC.

The error correction code generation circuit 110 and the error correction circuit 120 may generate an error correction code ECC by using a check matrix, which is also called an H matrix, and correct an error based on the error correction code ECC. This will be described below.

FIG. 2 shows an example of a check matrix used by the error correction code generation circuit 110 and the error correction circuit 120. Here, for the sake of convenience in description, data has 8 bits D0 to D7 and an error correction code ECC has 4 bits E0 to E3.

The check matrix may be formed of a matrix of (the number of bits of the error correction code)×(the number of bits of an error correction code+the number of bits of a data).

Here, since the error correction code is formed of 4 bits and the data is formed of 8 bits, the check matrix may be a 4×12 matrix. Each component of the check matrix may have a value of 1 or 0.

The column vectors of the check matrix may respectively correspond to the bits D0 to D7 of the data DATA and the bits E0 to E3 of the error correction code ECC. For example, among the 12 column vectors, 8 column vectors may correspond to the bits D0 to D7 of the data DATA, and 4 column vectors may correspond to the bits E0 to E3 of the error correction code ECC. In FIG. 2, it may be seen that 'D1' corresponds to a column vector having a value of '1101', and 'E2' corresponds to a column vector having a value of '0010'.

FIG. 3 shows how the error correction code generation circuit 110 uses the check matrix.

The error correction code generation circuit 110 may generate an error correction code ECC in such a manner that each of the column vectors of the check matrix is multiplied by the corresponding data bit or the corresponding ECC bit and then the sum of each row becomes 0 (which is an even number).

That is, an error correction code ECC may be generated to satisfy all of the following four equations.

$$1*D0+1*D1+1*D2+0*D3+1*D4+1*D5+1*D6+1*D7+1*E0+0*E1+0*E2+0*E3=0 \quad \text{[Equation 1]}$$

$$1*D0+1*D1+0*D2+1*D3+1*D4+0*D5+0*D6+1*D7+0*E0+1*E1+0*E2+0*E3=0 \quad \text{[Equation 2]}$$

$$1*D0+0*D1+1*D2+1*D3+0*D4+1*D5+0*D6+1*D7+0*E0+0*E1+1*E2+0*E3=0 \quad \text{[Equation 3]}$$

$$0*D0+1*D1+1*D2+1*D3+0*D4+0*D5+1*D6+1*D7+0*E0+0*E1+0*E2+1*E3=0 \quad \text{[Equation 4]}$$

FIG. 4 shows a result of the error correction code generation circuit 110 generating an error correction code ECC (0,1,1,0) for data DATA (1,1,0,0,1,0,1,0) by using the check matrix of FIG. 2.

When the data DATA (1,1,0,0,1,0,1,0) and the error correction code ECC (0,1,1,0) are put into the above four equations, it may be seen that they are satisfied as follows:

$$1*1+1*1+1*0+0*0+1*1+1*0+1*1+1*0+1*0+0*1+0*1+0*0=0$$

$$1*1+1*1+0*0+1*0+1*1+0*0+0*1+1*1+0*0+0*1+0*1+0*0=0$$

$$1*1+0*1+1*0+1*0+0*1+1*0+0*1+1*1+0*0+0*1+1*0+0*0=0$$

$$0*1+1*1+1*0+1*0+0*1+0*0+1*1+1*1+0*0+0*1+0*0+1*1=0$$

Equations 1 to 4 may also be used in a process that the error correction circuit 120 corrects an error of the data DATA and an error of the error correction code ECC based on the error correction code ECC. When the result of calculating the above four equations is Equation 1=0, Equation 2=0, Equation 3=0, and Equation 4=0, it may represent that there is no error within the data DATA. When there is a calculation result representing otherwise, it may represent that there is an error at the location represented by the calculation result.

FIG. 5 shows a process of the error correction circuit 120 correcting an error based on an error correction code ECC.

In FIG. 5, it is shown that an error occurs in which D6 is changed from 1 to 0 (1→0) among the data (1,1,0,0,1,0,1,0) so that the data DATA becomes (1,1,0,0, 1,0,0,0).

Calculating Equation 1-4 by putting the data DATA (1,1,0,0,1,0,0,0) having the error and the error correction code ECC (0,1,1,0) into the check matrix gives the following result.

1*1+1*1+1*0+0*0+1*1+1*0+1*0+1*0+1*0+0*1+ 0*1+0*0=1

**1*1+1*1+0*0+1*0+1*1+0*0+0*0+1*0+0*0+1*1+ 0*1+0*0=0**

1*1+0*1+1*0+1*0+0*1+1*0+0*0+1*0+0*0+0*1+ 1*1+0*0=0

0*1+1*1+1*0+1*0+0*1+0*0+1*0+0*1+1*0+0*0+0*1+0*1+ 1*0=1

In this result, 1,0,0,1 may represent the location of the error. Among the column vectors of the check matrix, the column vector having a value of 1,0,0,1 is a column vector corresponding to D6. Thus, the error correction circuit 120 may determine that there is an error in D6 and correct the error by inverting the value of D6 from 0 to 1 (0→1). That is, the error may be corrected.

FIG. 6 shows another process of the error correction circuit 120 correcting an error based on an error correction code ECC.

In this case, errors occur in D0 and D3 among the data (1,1,0,0,1,0,1,0) and the data DATA becomes (0,1,0,1,1,0,1,0).

Calculating Equation 1-4 by putting the data DATA (0,1,0,1,1,0,1,0) having the errors and the error correction code ECC (0,1,1,0) into the check matrix gives the following result.

1*0+1*1+1*0+0*0+1*1+1*1+1*0+1*1+1*0+1*0+0*1+ 0*1+0*0=1

1*0+1*1+0*0+0*1+1*1+1*1+0*0+0*0+1*1+1*0+0*0+1*1+ 0*1+0*0=0

1*0+0*1+1*0+0*1+1*1+0*1+1*0+0*1+1*1+0*0+0*0+0*1+ 1*1+0*0=0

0*0+1*1+1*0+1*1+0*1+0*1+1*0+1*1+0*0+0*0+0*1+ 0*1+1*0=1

In this result, (1,0,0,1) may represent the location of the error, and the column vector having a value of 1,0,0,1 among the column vectors of the check matrix is a column vector corresponding to D6. Thus, the error correction circuit 120 may determine that there is an error in D6, and correct the error by inverting the value of D6 from 1 to 0 (1→0). As a result of the error correction, the data Data may become (0,1,0,1,1,0,0,0). As shown above, when there are errors in 2 bits (D0 and D3) of the data DATA, the error correction circuit 120 cannot correct the errors and rather it may mis-correct D6 which is not erroneous and increase the number of errors to 3 bits. In this case, the error correction circuit 120 does not reduce the number of errors in the memory, but rather increases the number of errors.

Figure 7:
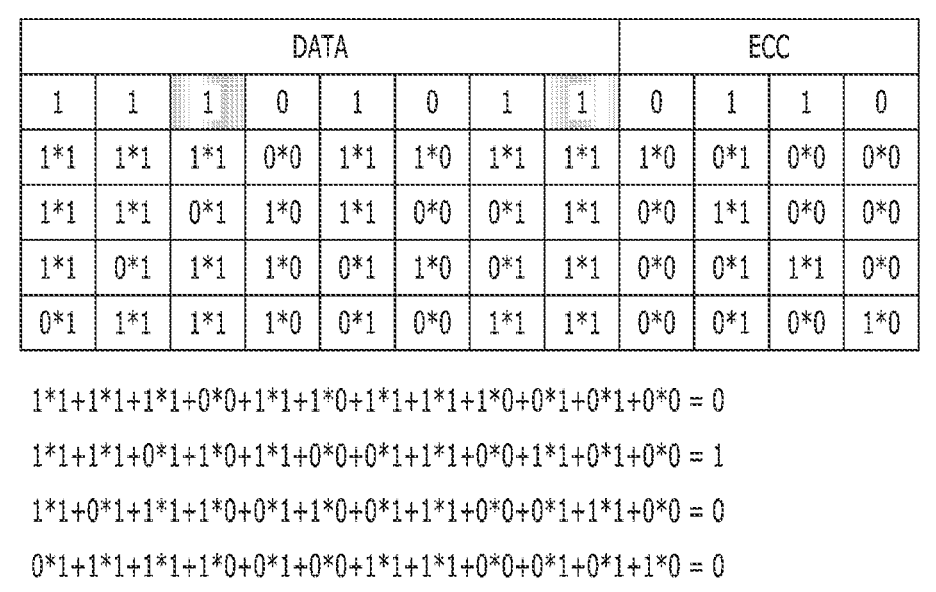

FIG. 7 shows yet another process of the error correction circuit 120 correcting an error based on an error correction code ECC.

In FIG. 7, errors occur in D2 and D7 in the data (1,1,0, 0,1,0,1,0) and the data DATA becomes (1,1,1,0,1,0,1,1).

Calculating Equation 1-4 by putting the data DATA (1,1,1,0,1,0,1,1) including errors and the error correction code ECC (0,1,1,0) into the check matrix gives the following result.

1*1+1*1+1*1+0*0+1*1+0*0+1*1+1*1+1*0+0*1+ 0*1+0*0=0

1*1+1*1+0*1+1*0+1*1+0*0+0*0+1*1+1*1+0*0+0*1+1*1+ 0*1+0*0=1

1*1+0*1+1*1+1*0+1*1+0*0+1*1+1*0+0*1+1*1+1*1+0*0+0*1+ 1*1+0*0=0

0*1+1*1+1*1+1*0+0*1+0*0+1*1+1*1+0*0+0*1+ 0*1+1*0=0

In this result, (0,1,0,0) may represent the location of the errors, and the column vector having a value of 0,1,0,0 among the column vectors of the check matrix is a column vector corresponding to E1. Thus, the error correction circuit 120 may determine that there is an error in E1, and it may correct the error by inverting the value of E1 from 1 to 0 (1→0). As a result of the error correction, the data may be maintained as (1,1,1,0,1,0,1,1) and the error correction code ECC may become (0,0,1,0). That is, the errors in the two bits of the data DATA may not be corrected, and an error of one bit may be added to the error correction code ECC due to the mis-correction.

In this case, the mis-correction may occur only in the error correction code ECC and may not occur in the data DATA. Since the error correction code ECC is used only in an error correction operation and is not output to the outside of the memory, it may not affect the reliability of the system including the memory.

Although the number of errors increases due to the mis-correction of the error correction circuit 120 in both of the error correction processes of FIGS. 6 and 7, the errors increase in the data which affects the reliability of the memory in the case of FIG. 6, and the errors increase the error correction code ECC which does not affect the reliability of the system including the memory in the case of FIG. 7. In short, when the mis-correction can be made to occur not in the data DATA but in the error correction code ECC, the reliability of the memory system 100 may not be degraded.

Figure 8:
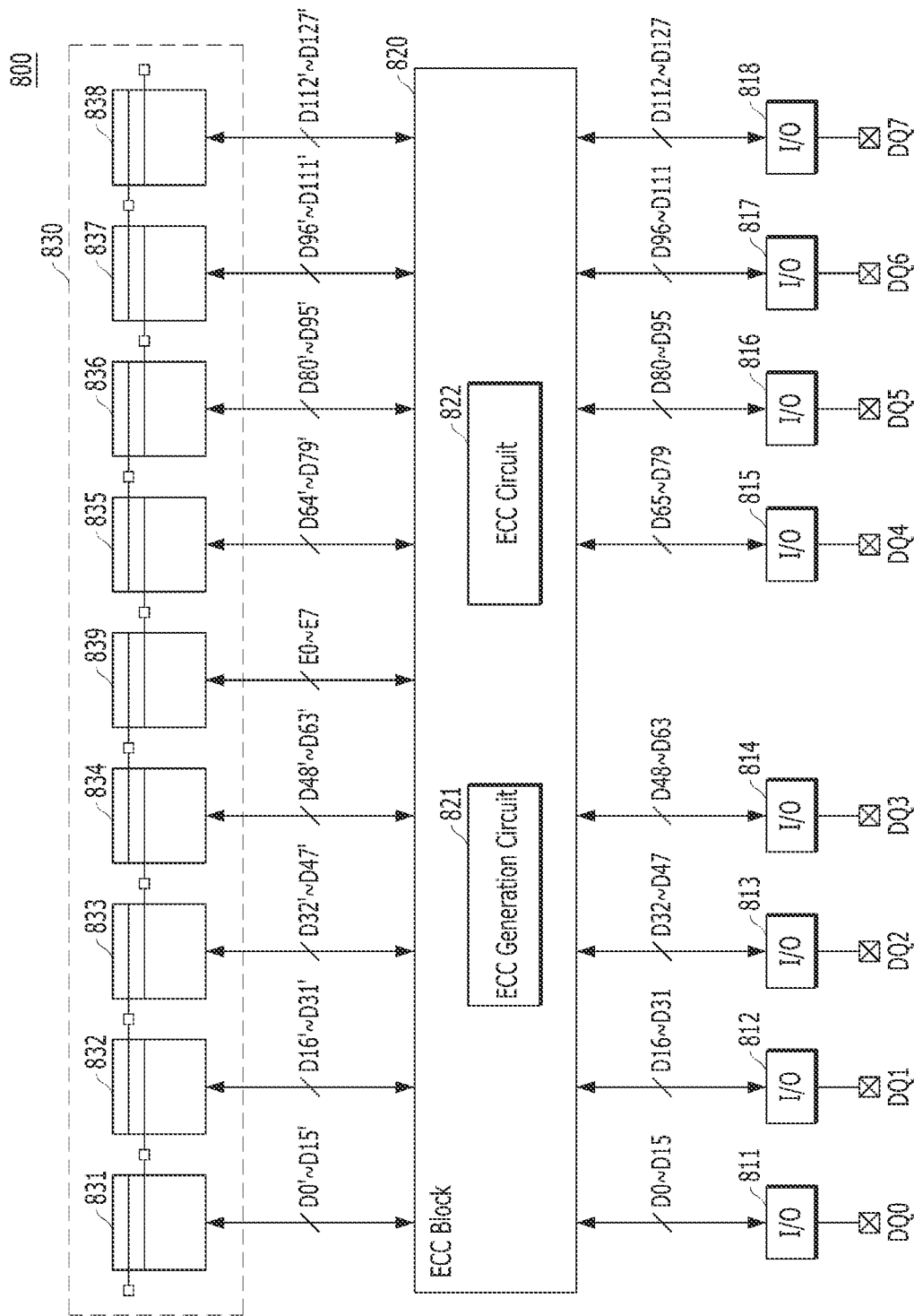
FIG. 8 is a block diagram illustrating a memory 800 in accordance with an embodiment of the present invention.

FIG. 8 is a block diagram illustrating a memory 800 in accordance with an embodiment of the present invention.

Referring to FIG. 8, the memory 800 may include data pads DQ0 to DQ7, data input/output circuits 811 to 818, an ECC block 820, and a memory core 830.

The data input/output circuits 811 to 818 may input/output a data D0 to D127 through the data pads DQ0 to DQ7. During a write operation, a 16-bit data may be input through one data pad, and during a read operation, a 16-bit data may be output through one data pad. Since there are eight data pads DQ0 to DQ7 in the memory 800, a 128-bit data D0 to D127 may be input to the memory 800 during a write operation, and a 128-bit data D0 to D127 may be output from the memory 800 during a read operation.

The ECC block 820 may include an error correction code generation circuit 821 and an error correction circuit 822. The error correction code generation circuit 821 may generate an 8-bit error correction code ECC based on the 128-bit data D0 to D127 received through the data input/output circuits 811 to 818 during a write operation. That is, the error correction code generation circuit 821 may generate an 8-bit error correction code ECC based on the 128-bit data D0 to D127 being used as a message. Since only the error correction code ECC is generated by the error correction code generation circuit 821 and no error correction operation is performed during the write operation, the data D0 to D127 input to the ECC block 820 and the data D0' to D127' output from the ECC block 820 may be the same.

The error correction circuit 822 may correct an error in the data D0' to D127' transferred from the memory core 830 based on the error correction code ECC transferred from the memory core 830. Here, correcting an error may mean detecting an error in the data D0' to D127' based on the error correction code ECC, and when an error is detected, correcting the error. The data input/output circuits 811 to 818 may output the data D0 to D127 whose errors are corrected by the error correction circuit 822 to the outside of the memory 800.

The memory core 830 may include a plurality of cell regions 831 to 839. The cell regions 831 to 838 and the data input/output circuits 811 to 818 may correspond 1:1. For example, the cell region 831 may store the data D0' to D15' received through the data input/output circuit 811, and the cell region 833 may store the data D32' to D47' received through the data input/output circuit 813. Also, the cell region 839 may store the error correction code ECC. Squares between the cell regions 831 to 839 may represent sub-word line drivers, and lines extending to the left and right of the sub-word line drivers may represent sub-word lines. Actually, there are a much larger number of sub-word line drivers and sub-word lines, but only some of them are shown here to simply show the structure. Since neighboring cell regions among the cell regions 831 to 839 share the sub-word line drivers, when an error occurs in a sub word line driver, an error is highly likely to occur in the cell regions on both sides of the sub-word line driver. For example, since the cell region 833 and the cell region 834 share a sub-word line driver, when an error occurs in the sub-word line driver which is shared by the cell regions 833 and 834, both of the cell regions 833 and 834 may be erroneous simultaneously.

Figure 9:
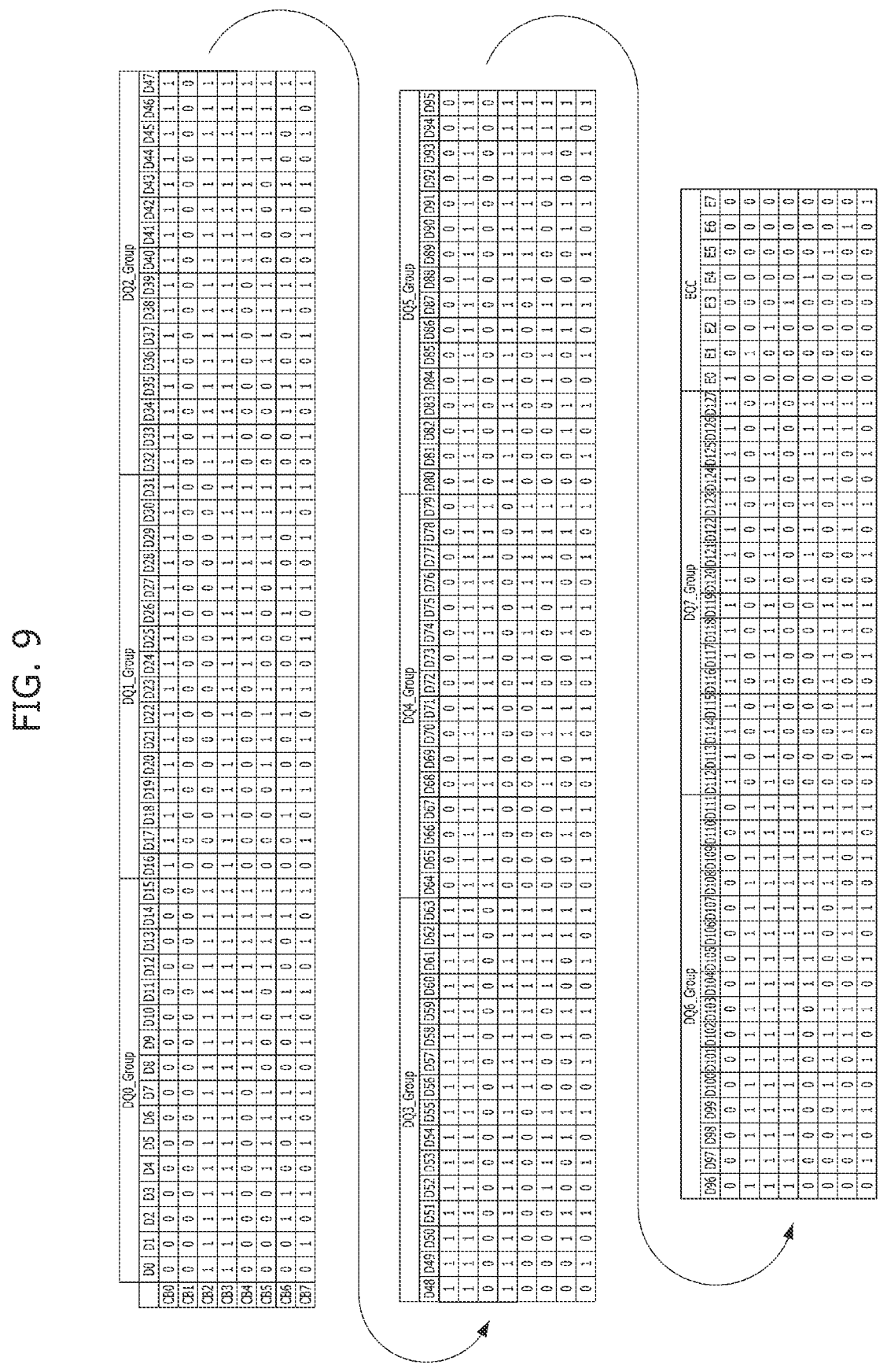

In FIG. 8, the 128-bit data D0 to D127 are input/output to/from the memory 800 during a one-time write and read operation, and an 8-bit error correction code ECC is used. However, this is merely an example, and it may be apparent to those skilled in the art to which the present invention pertains that the number of bits of the data and the number of bits of the error correction code may be different from the example of FIG. 8, FIG. 9 shows an example of a check matrix used by the error correction code generation circuit 821 and the error correction circuit 822 of the ECC block 820 shown in FIG. 8.

The check matrix may be formed of a matrix of (the number of bits of the error correction code)×(the number of bits of the error correction code+the number of bits of the data). Here, since the error correction code is of 8 bits and the data is of 128 bits, the check matrix may be formed of an 8×136 matrix. Each component of the check matrix may have a value of 1 or 0.

A message D0 to D127 may be divided into eight data groups DQ0_Group to DQ7_Group. Here, the data received through the same data pad may be grouped into the same group. For example, the 16-bit data D0 to D15 received through the data pad DQ0 may belong to the data group DQ0_Group, and the 16-bit data D96 to D111 received through the data pad DQ6 may belong to the data group DQ6_Group.

In the check matrix, the message part may include 8 group indicators and 8 parts of bit indicators. In FIG. 9, the thick-line box corresponding to each of the data groups DQ0_Group to DQ7_Group may correspond to the group indicator of a corresponding data group. The 8 group indicators may correspond to the 8 data groups DQ0_Group to DQ7_Group, respectively. The 8 group indicators may discriminate the 8 data groups DQ0_Group to DQ7_Group. In FIG. 9, remaining bits other than the group indicators may be the 8 parts of bit indicators. The 8 parts may correspond to the data groups DQ0_Group to DQ7_Group, respectively. Each part of bit indicators may discriminate 16-bit data inside a corresponding data group of the 8 data groups DQ0_Group to DQ7_Group.

Referring to FIG. 9, D0 to D15 and CB0 to CB3 may be the group indicator of the data group DQ0_Group, and D0 to D15 and CB4 to CB7 may be the bit indicator of the data group DQ0_Group. Also, D32 to D47 and CB0 to CB3 may be the group indicator of the data group DQ2_Group, and D32 to D47 and CB4 to CB7 may be the bit indicator of the data group DQ2_Group. Referring to FIG. 9, it may be seen from the group indicators that all columns have the same value in the same group indicator. For example, all columns of the group indicator of the data group DQ3_Group may have a value of '1101', and all columns of the group indicator of the data group DQ5_Group may have a value of '0101'. Also referring to FIG. 9, it may be seen that the bit indicators have the same value in all data groups. For example, the 4×16 bit indicators corresponding to the data group DQ0_Group may have the same value as the 4×16 bit indicators corresponding to each of the other data groups DQ1_Group to DQ7_Group.

The error correction code generation circuit 821 and the error correction circuit 822 may generate an error correction code ECC based on the check matrix of FIG. 9 in the same manner as described in FIGS. 3 to 7, and correct errors in the data D0' to D127'.

When multiple errors occur only in one cell region among the cell regions 831 to 838, that is, when multiple errors occur only in one data group among the data groups DQ0_Group to DQ7_Group, mis-correction may not occur or may occur only in the data group. For example, when an even number of errors occur only in the data group DQ1_Group, the sum of the group indicators at the locations where the errors occur may be '0000' (e.g., 1001+1001=0000). Since there is no data group corresponding the group indicator '0000', mis-correction may not occur. Also, when an odd number of errors occur only in the data group DQ1_Group, the sum of the group indicators at the locations where the errors occur may become '1001' (e.g., 1001+1001+1001=1001). Thus, mis-correction may occur in the data group DQ1_Group. The increase in the number of errors caused by mis-correction in the data group in which the errors occur may not cause any problem in the reliability of the system. This is because it is possible to correct an error even though the number of errors increases in one symbol since the memory controller that controls the memory 800 recognizes each of the data groups DQ0_Group to DQ7_Group as one symbol and performs an error correction operation on the basis of a symbol.

Since the cell regions 831 to 839 share the sub-word line driver between the neighboring cell regions, there is a high possibility that errors occur simultaneously in the neighboring cell regions. For example, when an error occurs in the cell region 831, the cell region 832 is also highly likely to be erroneous as well. When an odd number of errors occur in the data group DQ0_Group corresponding to the cell region 831 and an odd number of errors occur in the data group DQ1_Group corresponding to the cell region 832, the sum of the two group indicators may be 0011+1001=1010. Thus, mis-correction may occur in the data group DQ7_Group corresponding to the group indicator '1010'. Since a new error occurs, due to mis-correction, in the data group DQ7_Group that does not have any error, this may greatly deteriorate the reliability of the system including the memory 800.

In order to increase the reliability of the system including the memory, the following conditions (A) and (B) have to be achieved.

Condition (A): When multiple errors occur in one data group, mis-correction should not occur or should occur only in the data group.

Condition (B): When an odd number of errors occur simultaneously in each of two data groups corresponding to two neighboring cell regions, mis-correction should not occur in the other data groups. Mis-correction may occur in the error correction code.

In order to achieve the above conditions (A) and (B), the check matrix may have to satisfy the following rules (1) and (2).

Rule (1): The check matrix should have the group indicators. As shown in FIG. 9, condition (A) may be achieved by the group indicators for distinguishing the data groups DQ0_Group to DQ7_Group. Due to the group indicators of the check matrix, mis-correction does not occur in one data group when an even number of errors occur in the data group and mis-correction occurs only in the data group when an odd number of errors occur in the data group.

Rule (2): The hamming distance between the group indicators respectively corresponding to the neighboring data groups should be 1 or 4 (that is, half the number of bits of the error correction code). Here, the neighboring data groups may refer to data groups corresponding to the neighboring cell regions. For example, the data group DQ0_Group may correspond to the cell region 831, and the data group DQ1_Group may correspond to the cell region 832, but since the cell regions 831 and 832 are adjacent to each other, the data groups DQ0_Group and DQ1_Group may be neighboring data groups. However, the data group DQ3 Group may correspond to the cell region 834, and the data group DQ4_Group may correspond to the cell region 835, and the cell region 839 exists between the cell regions 834 and 835. Since the cell regions 834 and 835 are not adjacent to each other, the data groups DQ3_Group and DQ4_Group may not be neighboring data groups. Rule (2) may be a rule for ensuring that the sum of the group indicators of the neighboring data groups have a value that is different from that of any group indicator.

The check matrix of FIG. 9 may satisfy Rule (1) but may not satisfy Rule (2).

FIG. 10 shows group indicators satisfying Rule (1) and Rule (2) in accordance with an embodiment of the present invention. The part corresponding to the error correction code ECC in the check matrix and bit indicators may be the same as those shown in FIG. 9.

Referring to FIG. 10, it may be seen that a hamming distance between the group indicators (0,0,1,1) and (1,0,1,1) respectively corresponding to the neighboring data groups DQ0_Group and DQ1_Group is 1, and a hamming distance between the group indicators (1,0,1,1) and (1,0,0,1) respectively corresponding to the neighboring data groups DQ1_Group and DQ2_Group is 1, and a hamming distance between the group indicators (1,0,0,1) and (1,1,0,1) respectively corresponding to the neighboring data groups DQ2_Group and DQ3_Group is 1. Also, a hamming distance between the group indicators (0,1,1,0) and (0,1,1,1) respectively corresponding to the neighboring data groups DQ4_Group and DQ5 Group is 1, and a hamming distance between the group indicators (0,1,1,1) and (0,1,0,1) respectively corresponding to the neighboring data groups DQ5_Group and DQ6_Group is 1, and a hamming distance between the group indicators (0,1,0,1) and (1,0,1,0) respectively corresponding to the neighboring data groups DQ6_Group and DQ7_Group is 4.

When a group indicator is assigned as shown in FIG. 10, even though errors occur simultaneously in the neighboring data groups, reliability of the system may not be damaged.

When an odd number of errors occur in each of the neighboring data groups DQ0_Group and DQ1_Group, mis-correction may occur at the location represented by the sum of the group indicators of the data groups DQ0_Group and DQ1_Group, which is (0,0,1,1)+(1,0,1,1)=(1,0,0,0). Since (1,0,0,0) is the position of the error correction code E0, mis-correction may occur in the error correction code E0. Since the error correction code EU is not output to the outside of the memory, mis-correction of the error correction code may have no effect on the reliability of the system including the memory.

Also, when an odd number of errors occur in each of the neighboring data groups DQ6_Group and DQ7_Group, mis-correction may occur at the location represented by the sum of the group indicators of the data groups DQ6_Group and DQ7_Group, which is (0,1,0,1)+(1,0,1,0)=(1,1,1,1). However, since a group indicator corresponding to (1,1,1,1) does not exist, mis-correction may not occur in the end.

As shown in FIG. 10, when group indicators are assigned to the data groups DQ0_Group to DQ7_Group, the reliability of the system including the memory 800 may be greatly improved.

FIG. 11 shows group indicators satisfying Rule (1) and Rule (2) in accordance with another embodiment of the present invention. The part corresponding to the error correction code ECC in the check matrix and the bit indicators may be the same as those in FIG. 9.

Referring to FIG. 11, it may be seen that a hamming distance between the group indicators (0,0,1,1) and (1,0,1,1) respectively corresponding to the neighboring data groups DQ0_Group and DQ1_Group is 1, and a hamming distance between the group indicators (1,0,1,1) and (1,0,0,1) respectively corresponding to the neighboring data groups DQ1_Group and DQ2_Group, is 1, and a hamming distance between the group indicators (1,0,0,1) and (0,1,1,0) respectively corresponding to the neighboring data groups DQ2_Group and DQ3_Group, is 4. Also, a hamming distance between the group indicators (0,1,1,1) and (0,1,0,1) respectively corresponding to the neighboring data groups DQ4_Group and DQ5_Group is 1, and a hamming distance between the group indicators (0,1,0,1) and (1,0,1,0) respectively corresponding to the neighboring data groups DQ5_Group and DQ6_Group is 1, and a hamming distance between the group indicators (1,0,1,0) and (1,1,1,0) respectively corresponding to the neighboring data groups DQ6_Group and DQ7_Group is 1.

In FIG. 11, since the group indicators of the data groups DQ0_Group to DQ7_Group are allocated to satisfy Rule (1) and Rule (2), when the group indicators are allocated to the data groups DQ0_Group to DQ7_Group as shown in FIG. 11, the reliability of the system including the memory 800 may be greatly improved.

A failure in the sub-word line driver occurring in the memory may be detected by using the group indicator, which will be described below.

FIG. 12 is a diagram illustrating a pattern of failure occurring in a sub-word line driver of the memory in accordance with another embodiment of the present invention. Reference numeral '1201' of FIG. 12 indicates a sub-word line driver, and reference numerals '1202' and '1203' indicate cell regions sharing a sub-word line driven by the sub-word line drivers 1202 and 1203.

In (a) of FIG. 12, an error occurring at the initial stage of a failure of the sub-word line driver 1201 is illustrated. When failures occur in the sub-word line driver 1201, an error may occur from the end of the sub-word line extending to both sides of the sub-word line driver 1201 at the initial stage. For example, as shown in (a) of FIG. 12, errors may occur in a memory cell coupled to the rightmost side of a sub-word line which is coupled to the sub-word line driver 1201 and a memory cell coupled to the leftmost side of a sub-word line which is coupled to the sub-word line driver 1201. Herein, X in the figure indicates the occurrence of an error.

In (b) of FIG. 12, an error after a time passes after a failure of the sub-word line driver 1201 occurs is illustrated. When time passes after the failure of the sub-word line driver 1201 occurs, more errors may occur in a direction from both ends of the sub-word line driver 1201 toward the sub-word line driver 1201. For example, as shown in (b) of FIG. 12, an error may occur in the three memory cells at the right end of the sub-word line coupled to the sub-word line driver 1201, and an error may occur in the three memory cells at the left end of the sub-word line coupled to the sub-word line driver 1201.

As time passes, the number of errors occurring in the memory cells coupled to the sub-word line coupled to the sub-word line driver 1201 may further increase. Therefore, it may be important to detect a failure of the sub-word line driver 1201 at the early stage.

The following schemes 1 to 4 may be used to detect a failure of the sub-word line driver at the early stage.
1. A check matrix including a group indicator may be used for generation of an error correction code and error correction, and the Hamming distance of the group indicator may be different by a predetermined value between the neighboring data groups that are stored in the neighboring cell regions. Hereinafter, the predetermined value is 1.
2. During a read operation, a syndrome may be generated by calculating only a code portion which is generated by the group indicator in the error correction code with a read data.
3. The syndromes obtained from the calculation of the scheme 2 may be summed for each row. The syndromes generated during a read operation of all columns of a row may be summed. For example, when the value of the column address exists from 0 to 7, 8 syndromes generated in the 8 read operations that are performed while changing the column address from 0 to 7 in a third row may be summed.
4. When the sum of the 8 syndromes has the same predetermined value mentioned in the scheme 1, it may be determined that a sub-word line driver has a failure in the corresponding row.

Figure 13:
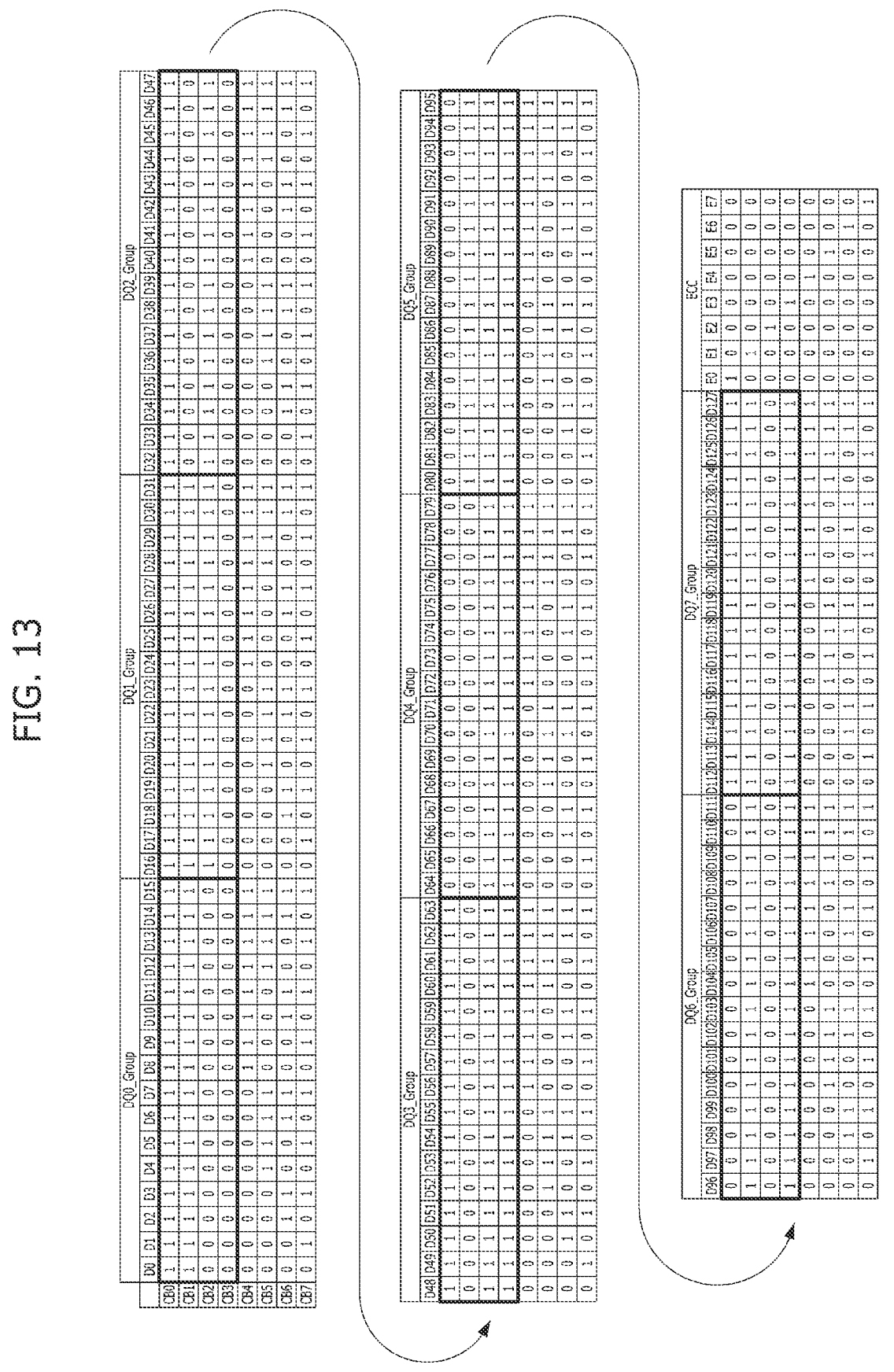

FIG. 13 is an example of a check matrix used to detect a failure of a sub-word line driver in accordance with another embodiment of the present invention.

The check matrix may be configured by message and ECC parts, the message part being a matrix of (number of bits of error correction code)×(number of bits of error correction code+number of bits of data) and the ECC part being a matrix of (number of bits of error correction code)×(number of bits of error correction code). Here, since the error correction code is 8 bits and the data is 128 bits, the check matrix may be a 8×136 matrix including the ECC part of 8×8 matrix. Each component of the check matrix may have a value of 1 or 0.

A message D0 to D127 may be divided into eight data groups DQ0_Group to DQ7_Group. Here, data received through the same data pad may be classified as a group. For example, 16-bit data D0 to D15 received through a data pad DQ0 may belong to the data group DQ0_Group, and the 16-bit data D96 to D111 received through a data pad DQ6 may belong to the data group DQ6 Group.

In the check matrix, the message part may include 8 group indicator parts for distinguishing the 8 groups DQ0_Group to DQ7_Group from each other corresponding to the 8 data groups DQ0_Group to DQ7_Group respectively, and 8 bit indicator parts for distinguishing 16-bit data in the 8 data groups DQ0_Group to DQ7_Group. A portion in a thick-line box individually corresponding to the data groups DQ0_Group to DQ7_Group may correspond to a group indicator part.

Referring to FIG. 13, D0 to D15 and CB0 to CB3 may be group indicators of the data group DQ0_Group, and D0 to D15 and CB4 to CB7 may be bit indicators of the data group DQ0_Group. Also, D32 to D47 and CB0 to CB3 may be group indicators of the data group DQ2_Group, and D32 to D47 and CB4 to CB7 may be bit indicators of the data group DQ2_Group. FIG. 13 shows that all columns within any single group indicator have the same value. For example, all columns of the group indicator of the data group DQ3_Group may have a value of '1011', and all columns of the group indicator of the data group DQ5_Group may have a value of '0111', Also, it may be seen that the bit indicators have the same value in all data groups. For example, the 4×16 bit indicator corresponding to the data group DQ0_Group and the 4×16 bit indicators corresponding to the other data groups DQ1_Group to DQ7_Group may have the same values.

Referring to FIG. 13, it may be seen that the Hamming distance between the group indicators of the neighboring data groups among the data groups DQ0_Group to DQ7_Group are all 1. For example, the Hamming distance between the value (1,1,1,0) of the group indicator of the data group DQ1_Group and the value (1,0,1,0) of the group indicator of the data group DQ2_Group may be 1, and the Hamming distance between the value (1,0,1,0) of the group indicator of the data group DQ2_Group and the value (1,0,1,1) of the group indicator of the data group DQ3_Group may be 1, and the Hamming distance between the value (1,0,1,1) of the group indicator of the data group DQ3_Group and the value (0,0,1,1) of the group indicator of the data group DQ4_Group may be 1.

Hereinafter, the eight group indicator parts in the check matrix may be collectively referred to as a group indicator portion. Also, the 8 bit indicator parts in the check matrix may be collectively referred to as a bit indicator portion. In other words, in the check matrix of FIG. 13, the 4×128 matrix of the parts CB0 to CB3 and D0 to D127 may be the group indicator portion, and the 4×128 matrix of the parts CB4 to CB7 and D0 to D127 may be a bit indicator portion.

Figure 14:
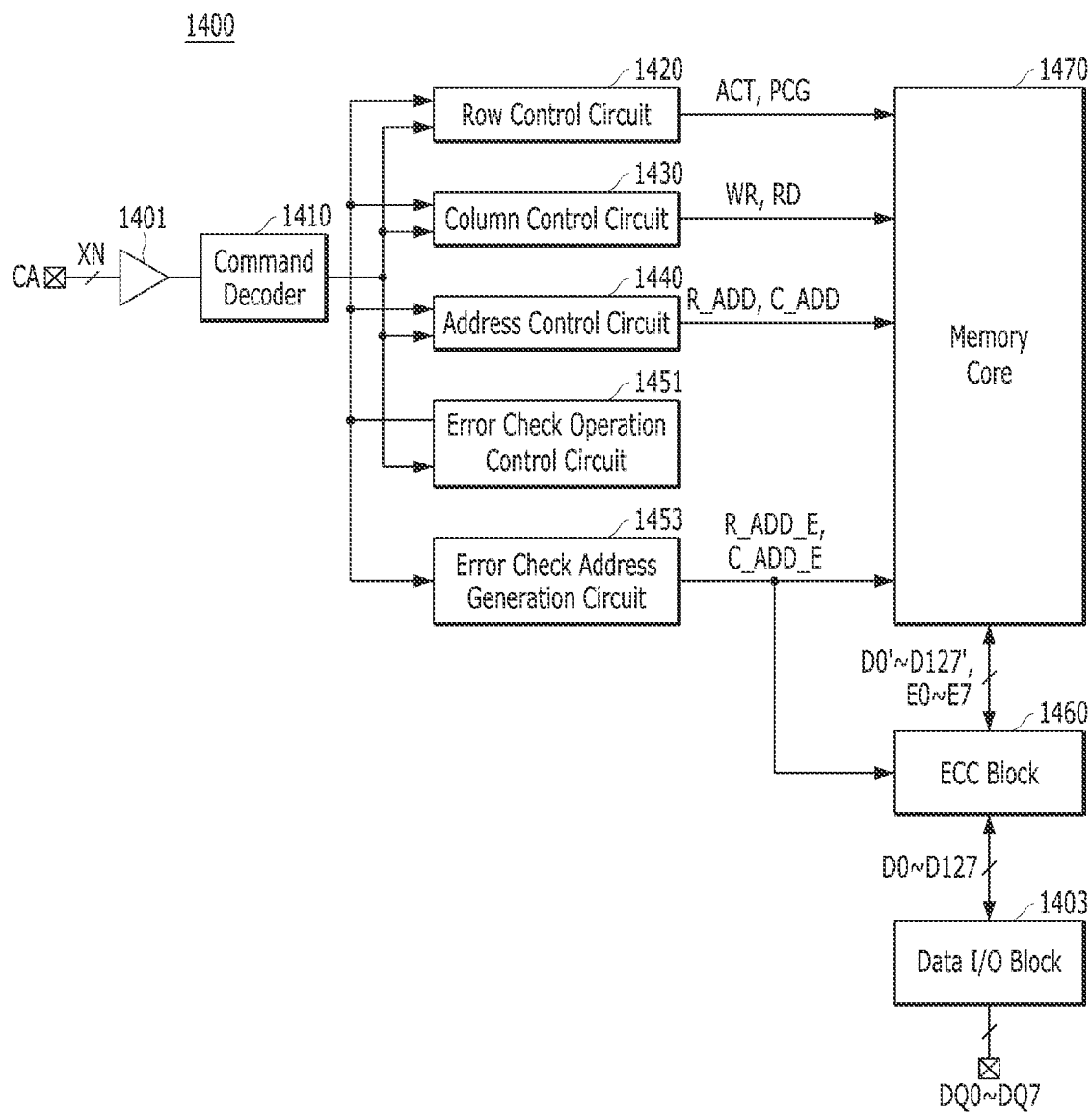
FIG. 14 is a block diagram illustrating a memory 1400 in accordance with another embodiment of the present invention.
Figure 15:
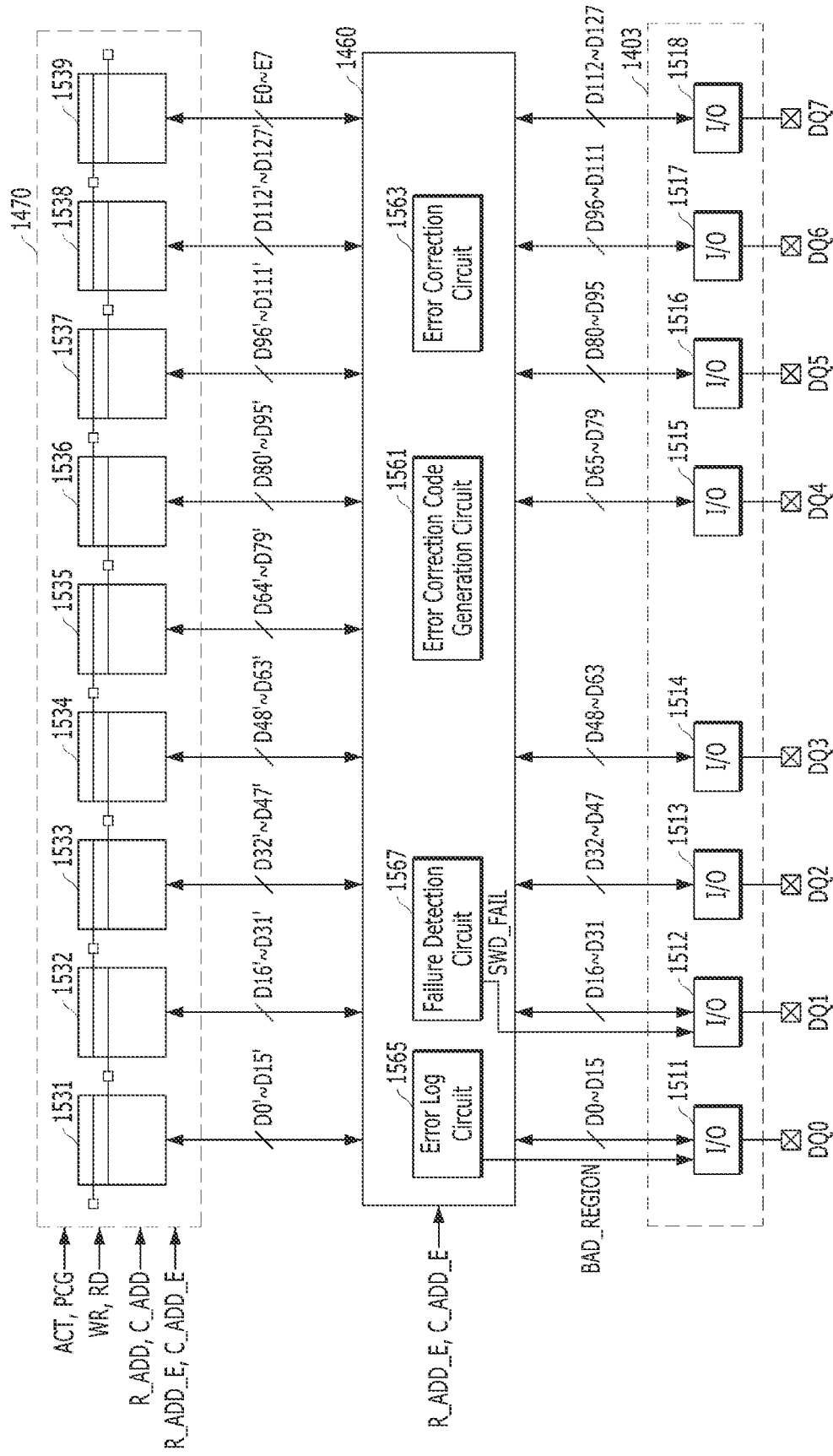
FIG. 15 is a block diagram illustrating a data input/output block 1403, an ECC block 1460, and a memory core 1470 shown in FIG. 14 in detail in accordance with another embodiment of the present invention.

FIG. 14 is a block diagram illustrating a memory 1400 in accordance with another embodiment of the present invention. FIG. 15 is a block diagram illustrating a data input/output block 1403, an ECC block 1460, and a memory core 1470 shown in FIG. 14 in detail in accordance with another embodiment of the present invention.

Referring to FIG. 14, the memory 1400 may include a command address receiving circuit 1401, a data input/output block 1403, a command decoder 1410, a row control circuit 1420, a column control circuit 1430, an address control circuit 1440, an error check operation control circuit 1451, an error check address generation circuit 1453, an ECC block 1460, and a memory core 1470.

The command address receiving circuit 1401 may receive a command and an address that are received through the command address pads CA. Depending on the type of the memory 1400, a command and an address may be input through the same input terminals or may be input through separate input terminals. Here, it is illustrated that the command and the address are input through N input terminals CA without distinction.

The data input/output block 1403 may receive or transfer data through the data pads DQ0 to DQ7. The data input/output block 1403 may receive data to be written into the memory core 1450 during a write operation, and transfer (or output) data read from the memory core 1450 during a read operation. Referring to FIG. 15, the data input/output block 1403 may include data input/output circuits 1511 to 1518 respectively corresponding to the data pads DQ0 to DQ7. During a write operation, a 16-bit data may be serially input through one data pad, and during a read operation, a 16-bit data may be serially output through one data pad. Since there are eight data pads DQ0 to DQ7 in the memory 1400, 128-bit data D0 to D127 may be input to the memory 1400 during a write operation, and 128-bit data may be output from the memory 1400 during a read operation.

The command decoder 1410 may decode the command and the address that are received through the command address receiving circuit 1401 to find out the type of an operation instructed by the memory controller to the memory 1400.

When it turns out as a result of the decoding of the command decoder 1410 that a row-based operation, such as an active operation or a precharge operation is instructed, the row control circuit 1420 may control these operations. An active signal ACT may be a signal for instructing an active operation, and a precharge signal PCG may be a signal for instructing a precharge operation.

When it turns out as a result of the decoding of the command decoder 1410 that a column-based operation, such as a write operation and a column operation is instructed, the column control circuit 1430 may control these operations. A write signal WR may be a signal for instructing a write operation, and a read signal RD may be a signal for instructing a read operation.

Moreover, when it turns out as a result of the decoding of the command decoder 1410 that an error check operation mode is instructed, the memory 1400 may operate in an error check operation mode. In the error check operation mode, the memory 1400 may operate under the control of the error check operation control circuit 1451.

The address control circuit 1440 may determine the address received from the command decoder 1410 as a row address R_ADD or a column address C_ADD, and transfer it to the memory core 1470. When it turns out as a result of the decoding of the command decoder 1410 that an active operation is instructed, the address control circuit 1440 may determine the received address as a row address R_ADD and when it turns out that read and write operations are instructed, the address control circuit 1440 may determine the received address as a column address C_ADD.

The error check operation control circuit 1451 may control an error check operation. The error check operation may also be referred to as an Error Check and Scrub (ECS) operation, and it may mean an operation of reading a data D0' to D127' and an error correction code E0 to E7 from the memory core 1470, and selecting a region with many errors by checking the data D0' to D127' for errors with the ECC block 1460. The error check operation control circuit 1451 may control the error check operation when an error check operation mode is set. Since it is required to control the rows and columns of the memory core 1470 during the error check operation, the error check operation control circuit 1451 may control the row control circuit 1420 and the column control circuit 1430 during the error check operation. Also, it is possible to control the ECC block 1460 related to the error check operation.

The error check address generation circuit 1453 may generate an error check address (R_ADD_E, C_ADD_E) which is to be used for an error check operation. The error check address (R_ADD_E, C_ADD_E) may include an error check row address R_ADD_E and an error check column address C_ADD_E. The error check address generation circuit 1453 may change the error check address (R_ADD_E, C_ADD_E) for each error check operation. The error check address generation circuit 1453 may increase the error check address (R_ADD_E, C_ADD_E) by one step, whenever an error check operation is performed. When the value of the error check row address R_ADD_E ranges from 0 to X and the value of the error check column address C_ADD_E ranges from 0 to Y, the error check address generation circuit 1453 may generate the error check address (R_ADD_E, C_ADD_E) as (0, 0) in the first error check operation. In the second error check operation, the error check address generation circuit 1453 may increase the error check address (R_ADD_E, C_ADD_E) by one step so as to generate the error check address (R_ADD_E, C_ADD_E) as (0, 1). Similarly, in the third error check operation, the error check address generation circuit 1453 may increase the error check address (R_ADD_E, C_ADD_E) by one step again so as to generate the error check address (R_ADD_E, C_ADD_E) as (0, 2). The error check address (R_ADD_E, C_ADD_E) may increase by 1 step at every error check operation so that the error check address (R_ADD_E, C_ADD_E) may be generated differently every time: (0, 0)→(0, 1)→(0, 2)→ . . . →(0, Y−1) →(0, Y)→(1, 0)→(1, 1)→ . . . →(1, Y−1)→(1, Y)→(2, 0)→(2, 1)→ . . . →(X, Y−1)→(X, Y), Since the error check address generation circuit 1453 changes the error check address (R_ADD_E, C_ADD_E) whenever an error check operation is performed, when the error check operation is repeatedly performed, the error check operation may be performed onto all memory cells of the memory core 1470.

The ECC block 1460 may include an error correction code generation circuit 1561, an error correction circuit 1563, an error log circuit 1565, and a failure determination circuit 1567 as illustrated in FIG. 15.

The error correction code generation circuit 1561 may generate the error correction code E0 to E7 based on the data D0 to D127 input through the data input/output circuits 1511 to 1518 during a write operation. The error correction code generation circuit 1561 may generate the error correction code E0 to E7 by using the data D0 to D127 as a message. During a write operation, only the error correction code E0 to E7 may be generated by the error correction code generation circuit 1561 but no error correction operation is performed. Therefore, during a write operation, the data D0 to D127 input to the ECC block 1460 and the data D0' to D127' output from the FCC block 1460 may be the same.

The error correction circuit 1563 may correct an error in the data D0' to D127' based on the error correction code E0 to E7 which is read from the memory core 1470. Here, correcting an error may mean detecting an error in the data D0' to D127' based on the error correction code E0 to E7 and correcting the detected error. The data D0 to D127 whose error is corrected by the error correction circuit 1563 may be output to the outside of the memory 1400 by the data input/output circuits 1511 to 1518.

The error log circuit 1565 may log the number of errors detected by the error correction circuit 1563 for each region (e.g., rows) of the memory core 1470. The error log circuit 1565 may determine and store a row in which the number of errors is equal to or greater than a threshold value among the rows of the memory core 1470 as a bad region.

The failure determination circuit 1567 may determine whether a sub-word line driver of a particular row has a failure or not by accumulating the values obtained by calculating the data D0' to D127' that are read from the memory core 1470 for each row of the memory core 1470 with a part E0 to E3 of the error correction code E0 to E7.

When there is a request from the memory controller, bad region information BAD_REGION collected by the error log circuit 1565 and failure information SWD_FAIL collected by the failure determination circuit 1567 may be transferred to the memory controller through the data input/output circuits 1511 and 1512.

Further description on the error correction code generation circuit 1561, the error correction circuit 1563, the error log circuit 1565, and the failure determination circuit 1567 will be described later with reference to FIG. 16.

The memory core 1470 may include a plurality of cell regions 1531 to 1539 as shown in FIG. 15. The cell regions 1531 to 1538 and the data input/output circuits 1511 to 1518 may correspond in 1:1. For example, the cell region 1531 may store the data D0' to D15' received through the data input/output circuit 1511, and the cell region 1533 may store the data D32' to D47' received through the data input/output circuit 1513. Also, the cell region 1539 may store an error correction code (ECC). Squares between the cell regions 1531 to 1539 may represent sub-word line drivers, and the lines extending to the left and right of the sub-word line drivers may represent sub-word lines. Although there are much more sub-word line drivers and sub-word lines in reality, only a few of them are shown herein to show their simple structure.

The memory core 1470 may perform an operation indicated by the signals ACT, PCG, WR, and RD. When an active signal ACT is activated, a row selected based on the row address R_ADD among the rows (sub-word lines) of the cell regions 1531 to 1539 may be activated. When a pre-charge signal PCG is activated, an activated row in the cell regions 1531 to 1539 may be deactivated. When a write signal WR is activated, the data D0' to D127' and the error correction code E0 to E7 may be transferred to the columns selected based on the column address C_ADD among the columns of the cell regions 1531 to 1539. When a read signal RD is activated, the data D0' to D127' and the error correction code E0 to E7 may be read from the columns that are selected based on the column address C_ADD. During an error check operation, the error check address (R_ADD_E, C_ADD_E) generated by the error check address generation circuit 1453 may be used instead of the addresses R_ADD and C_ADD of the address control circuit 1440.

Figure 16:
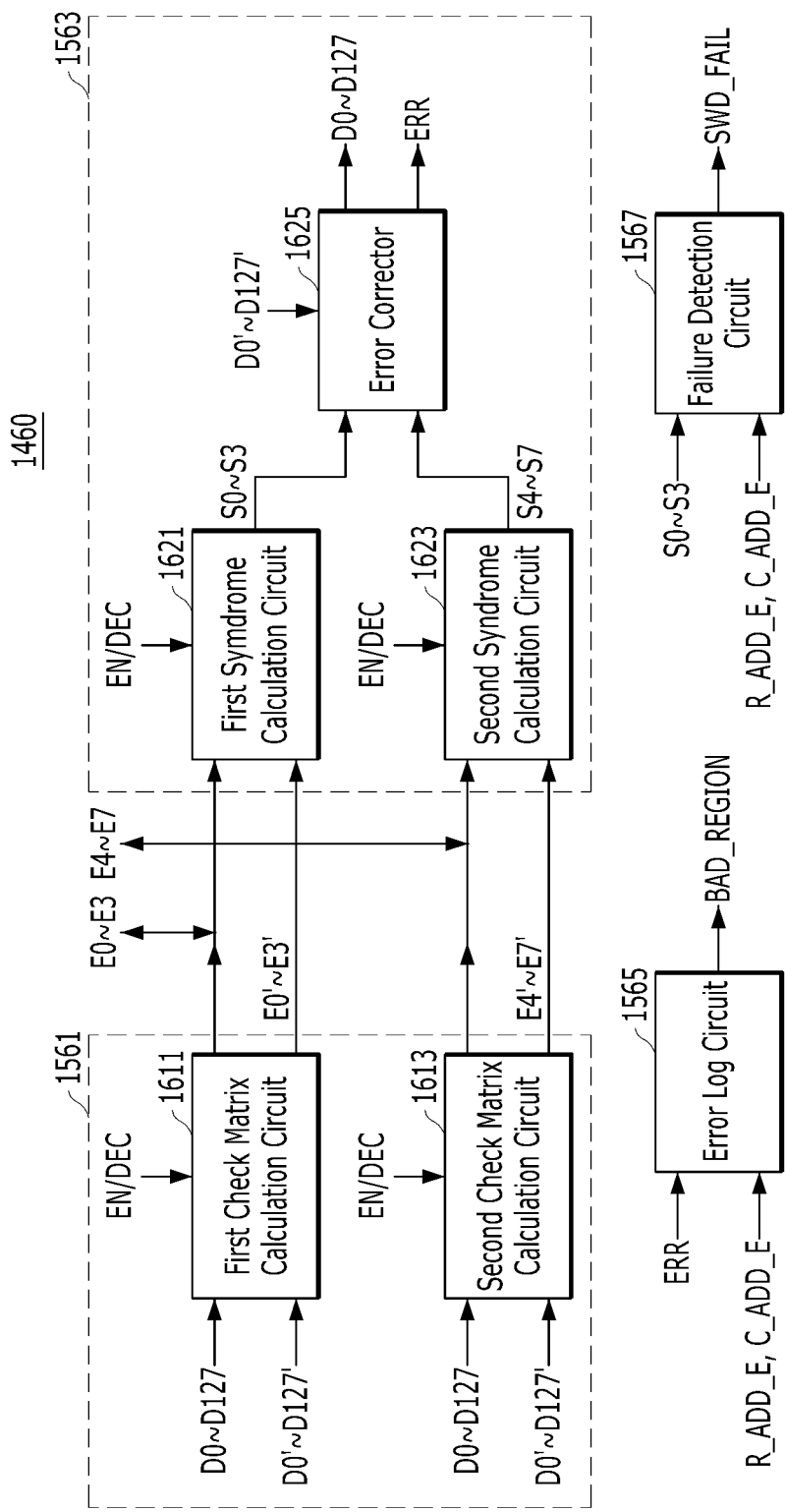
FIG. 16 is a detailed block diagram illustrating the ECC block 1460 shown in FIG. 15 in accordance with another embodiment of the present invention.

FIG. 16 is a detailed block diagram illustrating the ECC block 1460 shown in FIG. 15 in accordance with another embodiment of the present invention.

Referring to FIG. 16, the error correction code generation circuit 1561 may include a first check matrix calculation circuit 1611 and a second check matrix calculation circuit 1613. In order to reduce the circuit area by sharing a circuit that performs the same operation, the first check matrix calculation circuit 1611 and the second check matrix calculation circuit 1613 may be used not only for the generation of the error correction code E0 to E7 but also for error correction as well.

The first check matrix calculation circuit 1611 may generate a first parity E0 to E3 by calculating the group indicator portion of the check matrix shown in FIG. 13 and the write data D0 to D127 during an encoding operation where an encoding/decoding signal EN/DEC is activated, that is, during a write operation where the error correction code E0 to E7 is generated. Herein, the first parity E0 to E3 may represent a part of the error correction code E0 to E7. The generation of the first parity E0 to E3 of the first check matrix calculation circuit 1611 during an encoding operation may be expressed as shown in FIG. 17A. Referring to FIG. 17A, the first parity E0 to E3 expressed as a 4×1 matrix by performing a matrix multiplication operation on the group indicator portion, which is a 4×128 matrix, and the data D0 to D127 expressed as a 128×1 matrix may be generated. To have a look at only the EC part in the matrix multiplication operation of FIG. 17A, the first parity may be generated as follows: 1*D0+1*D1+1*D2+ . . . 0*D110+0*D111+1*D112+1*D113+ . . . 1*D126+1*D127=E0.

The second check matrix calculation circuit 1613 may generate a second parity E4 to E7 by calculating the bit indicator portion of the check matrix shown in FIG. 13 and the write data D0 to D127 during an encoding operation where an encoding/decoding signal EN/DEC is activated. Herein, the second parity E4 to E7 may represent a part of the error correction code E0 to E7. The generation of the second parity E4 to E7 of the second check matrix calculation circuit 1613 during an encoding operation may be expressed as shown in (b) of FIG. 17. Referring to (a) of FIG. 17, the second parity E4 to E7 expressed as a 4×1 matrix by performing a matrix multiplication operation on the bit indicator portion, which is a 4×128 matrix, and the data D0 to D127 expressed as a 128×1 matrix may be generated.

During the encoding operation, the first parity E0 to E3 and the second parity E4 to E7 generated by the first check matrix calculation circuit 1611 and the second check matrix calculation circuit 1613 may be stored in the memory core 1470.

The first check matrix calculation circuit 1611 may calculate the group indicator portion of the check matrix shown in FIG. 13 and the data D0' to D127' read from the memory core 1470 and generate calculation results E0' to E3' during a decoding operation where the encoding/decoding signal EN/DEC is deactivated, that is, during a read operation where an error correction operation is performed. The generation of the calculation results E0' to E3' of the first check matrix calculation circuit 1611 during the decoding operation may be expressed as shown in (c) of FIG. 17. Referring to (c) of FIG. 17, the calculation result E0' to E3' expressed as a 4×1 matrix may be generated by performing a matrix multiplication operation on the group indicator portion, which is expressed as a 4×128 matrix, and the data D0' to D127', which is expressed as a 128×1 matrix.

The second check matrix calculation circuit 1613 may calculate the bit indicator portion of the check matrix shown in FIG. 13 and the data D0' to D127' read from the memory core 1470 and generate calculation results E4' to E7' during a decoding operation where the encoding/decoding signal EN/DEC is deactivated. The generation of the calculation results E4' to E7' of the second check matrix calculation circuit 1613 during the decoding operation may be expressed as shown in (d) of FIG. 17. Referring to (d) of FIG. 17, the calculation result E4' to E7' expressed as a 4×1 matrix may be generated by performing a matrix multiplication operation on the bit indicator portion, which is expressed as a 4×128 matrix, and the data D0' to D127', which is expressed as a 128×1 matrix.

The error correction circuit 1563 may include a first syndrome calculation circuit 1621, a second syndrome calculation circuit 1623, and an error corrector 1625.

The first syndrome calculation circuit 1621 may be activated and operate during a decoding operation where the encoding/decoding signal EN/DEC is deactivated, that is, during a read operation where an error correction operation is performed, and may be deactivated during an encoding operation where the encoding/decoding signal EN/DEC is activated. The first syndrome calculation circuit 1621 may generate a first syndrome S0 to S3 by adding the first parity E0 to E3 which is read from the memory core 1470 to the calculation results E0' to E3' which is generated by the first check matrix calculation circuit 1611 during the decoding operation. The generation of the first syndrome S0 to S3 by the first syndrome calculation circuit 1621 may be expressed as an equation shown in (a) of FIG. 18.

The second syndrome calculation circuit 1623 may be activated and operate during a decoding operation where the encoding/decoding signal EN/DEC is deactivated, and may be deactivated during an encoding operation where the encoding/decoding signal EN/DEC is activated. The second syndrome calculation circuit 1623 may generate a second syndrome S4 to S7 by adding the second parity E4 to E7 which is read from the memory core 1470 to the calculation results E4' to E7' which is generated by the second check matrix calculation circuit 1613 during the decoding operation. The generation of the second syndrome S4 to S7 by the second syndrome calculation circuit 1623 may be expressed as an equation shown in (b) of FIG. 18.

The error corrector 1625 may correct errors in the data D0' to D127' read from the memory core 1470 based on the first syndrome S0 to S3 and the second syndrome S4 to S7. When the values of the first syndrome S0 to S3 and the second syndrome S4 to S7 are both 0, the error corrector 1625 may determine that there is no error in the data D0' to D127'. In this case, the data D0' to D127' input to the error corrector 1625 and the data D0 to D127 output from the error corrector 1625 may be the same.

When the values of the first syndrome S0 to S3 and the second syndrome S4 to S7 are not all 0, the error corrector 1625 may determine that there is an error in the data D0' to D127' and activate an error signal ERR. Also, as the value of the column vector of the check matrix among the data D0' to D127' inverts the same bits as those of the first syndrome S0 to S3 and the second syndrome S4 to S7, the error of the data D0' to D127' may be corrected. For example, when the values of the first syndrome S0 to S3 and the second syndrome S4 to S7 are (1,0,1,1,0,0,1,0), a portion of the check matrix whose column vector is (1,0,1,1,0,0,1,0) in FIG. 13 may be a data bit D50'. Therefore, the error of the data D0' to D127' may be corrected by inverting the data bit D50'. Similarly, if the values of the first syndrome S0 to S3 and the second syndrome S4 to S7 are (1,1,0,1,0,0,0,0), the data corresponding to the same column vector is an error in the data D0' to D127' may be corrected by inverting the bit D112'.

The error log circuit 1565 may log the number of errors that are detected by the error corrector 1625 for each region (e.g., each row) during an error check operation of the memory 1400, that is, the number of times that the error signal ERR is activated. The error log circuit 1565 may count the number of errors detected during the error check operation for each row of the memory core 1470, and classify and store the row whose number of detected errors is equal to or greater than a threshold value as a bad region. For example, when the threshold value is 3 and four errors are detected in a third row of the memory core 1470 during an error check operation, the error log circuit 1565 may classify and store the third row of the memory core 1470 as a bad region. Bad region information BAD_REGION output from the error log circuit 1565 may be information about the bad region stored by the error log circuit 1565. Since the error check address (R_ADD_E, C_ADD_E) is input to the error log circuit 1565, the error log circuit 1565 may be able to find out in which region an error is detected.

The failure determination circuit 1567 may accumulate the first syndromes for each region during an error check operation of the memory 1400. For example, when P read operations and P error correction operations are performed while changing the error check column address C_ADD_E ranging from 0 to (P−1) during the error check operation for a $K^{th}$ row of the memory (where K is an integer equal to or greater than 0), the generated P first syndromes S0 to S3 may be accumulated and stored. The accumulated and stored value may be called a vector. When the number of 1 is 1 in the vector obtained by accumulating the P first syndromes S0 to S3 and that errors occur on both sides of the sub-word line because there is a sub-word line failure in a $K^{th}$ row, the failure determination circuit 1567 may classify and store the $K^{th}$ row as a row having a sub-word line failure. The failure information SWD_FAIL output from the failure determination circuit 1567 may be information about a row having a sub-word line failure.

Figure 19:
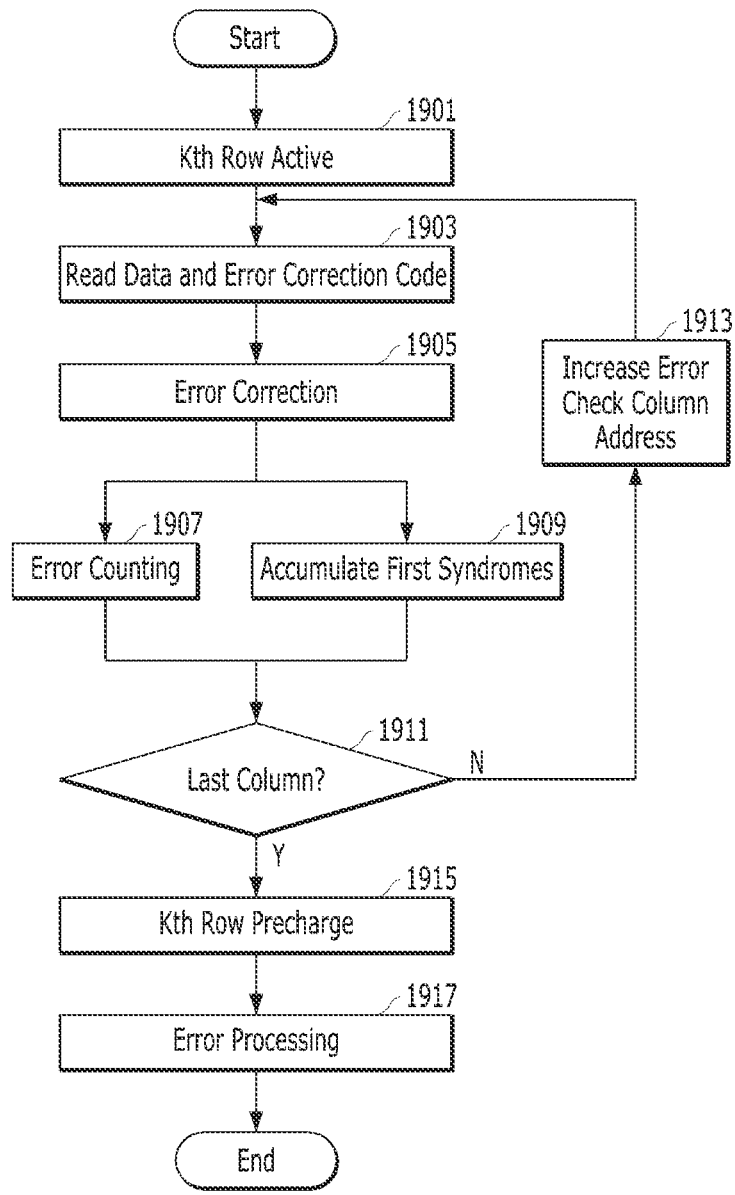
FIG. 19 is a flowchart describing a process performing an error check operation in the memory 1400 shown in FIG. 14 in accordance with another embodiment of the present invention.

FIG. 19 is a flowchart describing a process performing an error check operation in the memory 1400 shown in FIG. 14 in accordance with another embodiment of the present invention. FIG. 19 illustrates a process of performing an error check operation of one row (the $K^{th}$ row).

First, the $K^{th}$ row may be activated in operation S1901. In the cell regions 1531 to 1539 of the memory core 1470, the $K^{th}$ row may be selected and activated based on the error check row address R_ADD_E.

Subsequently, the data and the error correction code may be read in operation S1903. The data D0' to D127' and the error correction codes E0 to E7 may be read from the memory cells of a column which is selected based on the error check column address C_ADD_E in the $K^{th}$ row of the cell regions 1531 to 1539 of the memory core 1470.

An error correction operation may be performed in operation S1905. The first syndrome calculation circuit 1621 of the error correction circuit 1563 may generate the first syndrome S0 to S3, and the second syndrome calculation circuit 1623 may generate the second syndrome S4 to S7, and the error corrector 1625 may correct errors in the data D0' to D127' based on the first syndromes S0 to S3 and the second syndromes S4 to S7.

The error log circuit 1565 may count the number of errors in operation S1907. When the error signal ERR from the error corrector 1625 is activated, the error log circuit 1565 may increase the number of errors in the corresponding region, that is, the $K^{th}$ row.

The failure determination circuit 1567 may accumulate the values of the first syndromes S0 to S3 in operation S1909. The values of the first syndromes S0 to S3 that are generated during the error correction operation of the $K^{th}$ row may be added up and accumulated.

When the error check operation is performed on all columns of the $K^{th}$ row (Y in the operation S1911), the $K^{th}$ row may be precharged and the error check operation on the $K^{th}$ row may be terminated (in operation S1915).

After the error check operation for the $K^{th}$ row is terminated, an error processing operation may be performed (in operation S1917). The error log circuit 1565 may classify and store the $K^{th}$ row as a bad region when the number of errors detected during the error check operation on the $K^{th}$ row is equal to or greater than a threshold value. Also, when the number of 1 is 1 in the value obtained by accumulating the values of the first syndromes S0 to S3 that are generated during the error check operation of the $K^{th}$ row, the failure determination circuit 1567 may determine that there is a sub-word line failure in the $K^{th}$ row and classify and store the $K^{th}$ row as a row having a sub-word line failure.

When the error check operation is not performed for all columns of the $K^{th}$ row (N in the operation S1911), the error check column address may be increased (in the operation S1913), and the processes of the operations S1903, S1905, S1907, and S1909 may be performed again.

When the error check operation is performed in this way, a row whose number of errors is equal to or greater than the threshold value may be detected by the error log circuit 1565, and a row having a sub-word line driver failure, that is, a row where the number of errors is highly likely to increase in the future, may be detected by the failure determination circuit 1567.

According to the embodiments of the present invention, the number of errors that may occur in error correction of a memory may be decreased.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory, comprising:
   a first check matrix calculation circuit suitable for generating a first parity from a group indicator portion of a check matrix including stored write data, wherein the stored write data includes N data groups each of which is input through a different data pad, and the group indicator portion distinguishes the N data groups, where N is a positive integer;
   a memory core suitable for storing the stored write data and the first parity;
   a first syndrome calculation circuit suitable for generating a first syndrome by adding the first parity which is read from the memory core to a first calculation result obtained by calculating a product of the group indicator portion of the check matrix including the stored write data and read data which is read from the memory core; and
   a failure determination circuit suitable for accumulating the first syndrome for a region of the memory core to generate a vector, determining a presence of a failure of the region based on the vector, correcting the failure to thereby correct the read data read from the memory core, and transferring the corrected read data from the memory core.

2. The memory of claim 1, wherein:
   each of the N data groups includes a K-bit data, the first parity is of L bits, where K, L are positive integers,
   a size of the group indicator portion is L×(K*N), and K*N column vectors of the group indicator portion have the same value within each of the N data groups but have different values between different data groups of the N data groups.

3. The memory of claim 1, wherein:
   group indicators of neighboring data groups among the N data groups have a predetermined Hamming distance, and
   the failure determination circuit is configured to determine the region as a failure when a number of a specific value in the vector is the predetermined Hamming distance.

4. The memory of claim 3, wherein the predetermined Hamming distance is 1.

5. The memory of claim 1, wherein the neighboring data groups among the N data groups are data groups that are stored in neighboring cell regions among cell regions of the memory core.

6. The memory of claim 5, wherein the neighboring cell regions share at least one sub-word line driver.

7. The memory of claim 1, wherein:
   the memory core further stores a second parity, and
   the memory further includes:
   a second check matrix calculation circuit suitable for generating the second parity by calculating a bit indicator portion of the check matrix and the stored write data;
   a second syndrome calculation circuit suitable for generating a second syndrome by adding the second parity which is read from the memory core to a second calculation result obtained by calculating the bit indicator portion and the data which is read from the memory core; and
   an error corrector suitable for correcting an error of the data which is read from the memory core based on the first syndrome and the second syndrome.

8. The memory of claim 7, wherein:
   the first check matrix calculation circuit calculates the group indicator portion of the check matrix and the data which is read from the memory core during a read operation to produce the first calculation result, and transfers the first calculation result to the first syndrome calculation circuit; and
   the second check matrix calculation circuit calculates the bit indicator portion of the check matrix and the data which is read from the memory core during the read operation to produce the second calculation result, and transfers the second calculation result to the second syndrome calculation circuit.

9. The memory of claim 7, further comprising an error log circuit suitable for logging a number of errors detected by the error corrector for the region.

10. The memory of claim 9, wherein the operation of accumulating the first syndrome of the failure determination circuit and the operation of logging the number of errors of the error log circuit are performed during an error check operation.

11. A method for operating a memory, comprising:
    selecting a row of a memory core;
    reading data and an error correction code from memory cells that are selected by a column address of a first value in a selected row, wherein the error correction code includes a first parity that is obtained from a group indicator portion of a check matrix including stored write data, wherein the stored write data includes N data groups each of which is input through a different data pad, and the group indicator portion distinguishes the N data groups, where N is a positive integer;

generating a first syndrome by adding the first parity of the error correction code to a first calculation result obtained by calculating a product of the group indicator portion of the check matrix including the stored write data and the data;

repeating the reading and the generating by changing a value of the column address while accumulating the first syndrome for the row to generate a vector; and determining whether the row has a failure or not based on the vector, correcting the failure to thereby correct data read from the memory core, and transferring the corrected data from the memory core.

12. The method of claim 11, wherein the determining includes determining the row to have a failure when a number of a specific value in the vector is a predetermined value.

13. The method of claim 11, wherein the selecting, the reading, the generating, the repeating and the determining are performed during an error check operation of the memory.

14. The method of claim 11, wherein the repeating is performed until the data from all memory cells of the selected row and the error correction code are read.

* * * * *